(12) United States Patent
Cao

(10) Patent No.: US 8,560,264 B2
(45) Date of Patent: Oct. 15, 2013

(54) DIRECT CURRENT CIRCUIT TESTING DEVICE AND METHOD FOR USING SAME

(75) Inventor: Xiang Cao, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

(*) Notice: Subject to any disclaimer, the term of this patent is extended or adjusted under 35 U.S.C. 154(b) by 340 days.

(21) Appl. No.: 13/159,376

(22) Filed: Jun. 13, 2011

(65) Prior Publication Data

US 2012/0253730 A1 Oct. 4, 2012

(30) Foreign Application Priority Data

Apr. 2, 2011 (CN) .......................... 2011 1 0083787

(51) Int. Cl.
*G06F 19/00* (2011.01)

(52) U.S. Cl.
USPC ........... 702/118; 702/119; 702/183; 714/718; 714/723; 714/736; 455/573; 379/142.04; 379/142.17; 324/115

(58) Field of Classification Search
USPC .............. 702/118, 119, 183; 714/36, 42, 718, 714/724, 723, 736; 455/63.1, 417, 418, 455/550.1, 566, 571, 572, 573; 379/111, 379/142.04, 142.17; 340/7.51, 7.56; 324/115, 755.01, 755.07
See application file for complete search history.

(56) References Cited

U.S. PATENT DOCUMENTS

| | | | | |
|---|---|---|---|---|
| 5,625,669 | A * | 4/1997 | McGregor et al. | 455/418 |
| 5,715,518 | A * | 2/1998 | Barrere et al. | 340/5.8 |
| 7,339,367 | B2 * | 3/2008 | Heisler et al. | 324/115 |
| 7,746,222 | B2 * | 6/2010 | Kogan et al. | 340/506 |
| 8,086,919 | B2 * | 12/2011 | Chen et al. | 714/723 |
| 2002/0147561 | A1 * | 10/2002 | Baracat et al. | 702/119 |
| 2007/0252582 | A1 * | 11/2007 | Heisler et al. | 324/158.1 |
| 2007/0252605 | A1 * | 11/2007 | Heisler et al. | 324/754 |
| 2010/0241914 | A1 * | 9/2010 | Chen et al. | 714/718 |

* cited by examiner

*Primary Examiner* — Carol S Tsai
(74) *Attorney, Agent, or Firm* — Altis & Wispro Law Group, Inc.

(57) ABSTRACT

A method for testing electronic devices that are correspondingly connected to test units includes generating control signals for the electronic devices that are connected to one or more test units selected from the test units. A control unit adds ID codes corresponding to the selected test units to the control signals, and wirelessly transmits the control signals with the ID codes to all of the test units. Each of the test units compares the ID codes added to the control signals with its own stored ID code. When the ID code added to a control signal is in accordance with the ID code stored in one of the test units, the test unit controls the electronic device connected thereto to be turned on and off according to the control signal.

10 Claims, 3 Drawing Sheets

DIRECT CURRENT CIRCUIT TESTING DEVICE AND METHOD FOR USING SAME

BACKGROUND

1. Technical Field

The present disclosure relates to quality tests for electronic devices, and particularly to a direct current (DC) circuit testing device for electronic devices and a method for using the same.

2. Description of Related Art

Many electronic devices, such as mobile phones and personal computers (PCs), require their direct current (DC) circuit(s) to be tested. In a DC circuit quality test, each electronic device is electrically connected to a testing device (e.g., a multimeter or an oscilloscope) for measurement of their relevant parameters (e.g., working current, voltages, resistances etc.) of the electronic device, and is electrically connected to and disconnected from a DC power supply. When the tested electronic device is electrically connected to and disconnected from the DC power supply, the testing device measures relevant parameters, and determines whether the electronic device can work and shut down normally.

In most tests, the electronic device under test must be manually connected and disconnected from a power supply. With a large number of electronic devices for testing, an inordinate amount of time is spent in manually connecting and disconnecting these electronic devices.

Therefore, there is room for improvement within the art.

BRIEF DESCRIPTION OF THE DRAWINGS

Many aspects of the present disclosure can be better understood with reference to the following drawings. The components in the various drawings are not necessarily drawn to scale, the emphasis instead being placed upon clearly illustrating the principles of the present disclosure. Moreover, in the drawings, like reference numerals designate corresponding parts throughout the figures.

DETAILED DESCRIPTION

Figure 1:
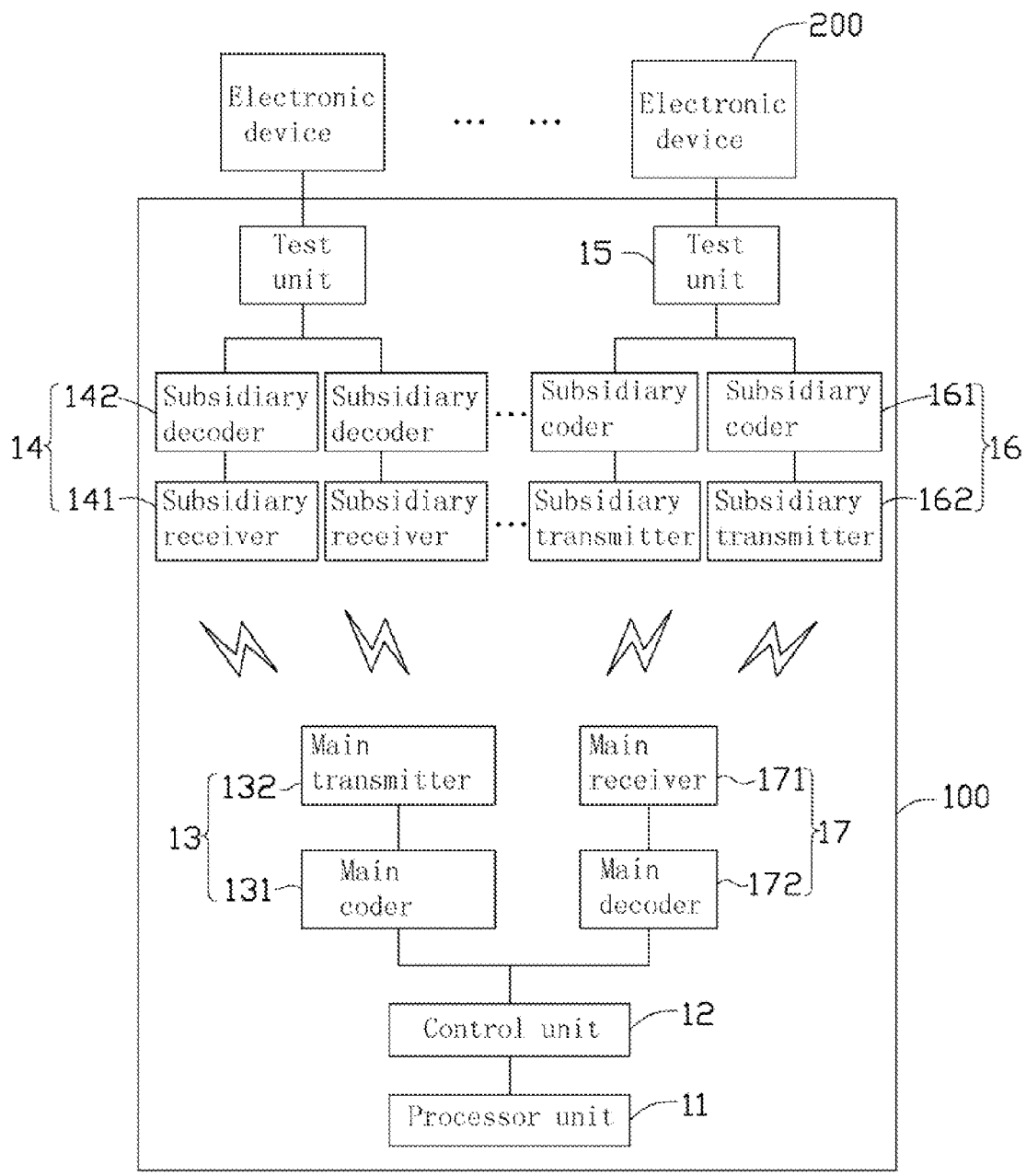
FIG. 1 is a block diagram of a direct current (DC) circuit testing device, according to an exemplary embodiment.

FIG. 1 shows a direct current (DC) circuit testing device 100, according to an exemplary embodiment. The DC circuit test device 100 is used to test quality of the DC circuits of a plurality of electronic devices 200, wherein the electronic devices 200 to be tested can be mobile phones, personal computers (PCs), or similar.

The DC circuit testing device 100 includes a processor unit 11, a control unit 12, a main code transmission unit 13, a plurality of subsidiary code receiver units 14, a plurality of test units 15, a plurality of subsidiary code transmission units 16, and a main code receiver unit 17. In general, the word "unit", as used herein, refers to logic embodied in hardware or firmware, or to a collection of software. The units described herein may be implemented as either software and/or hardware units and may be stored in any type of computer-readable medium.

In this embodiment, the processor unit 10 can be a personal computer (PC). The control unit 12 can be a single-chip computer, a microcontroller (MCU), or similar. The processor unit 10 is electrically connected to the control unit 12. In use, the processor unit 10 can generate signals for the electronic devices 200, and the control unit 12 can transform the generated signals into pulse signals.

The main code transmission unit 13 includes a main coder 131 electrically connected to the control unit 12, and a main transmitter 132 electrically connected to the main coder 131. Upon receiving the pulse signals from the control unit 12, the main coder 131 encodes the pulse signals to generate code signals, and the main transmitter 132 transmits the code signals using common wireless communication methods.

Each of the subsidiary code receiver units 14 includes a subsidiary receiver 141 and a subsidiary decoder 142 electrically connected to the subsidiary receiver 141. The subsidiary receiver 141 can receive the code signals transmitted from the main transmitter 132 using common wireless communication methods, and the subsidiary decoder 142 can decode the code signals received by the subsidiary receiver 141 into the original code signals.

Number of the test units 15 equals number of the subsidiary code receiver units 14. Each test unit 15 includes an MCU (not shown) and common test apparatus (e.g., a multimeter, an oscilloscope, etc.) for measuring relevant DC circuit working characteristics (e.g., working current, voltages, resistances, etc.) of the electronic devices 200. The subsidiary decoder 142 of each subsidiary code receiver unit 14 is electrically connected to a test unit 15 corresponding to the subsidiary code receiver units 14, such that the pulse signals generated by the subsidiary decoder 142 can be forwarded to the test unit 15. Each of the test units 15 can be electrically connected to one of the tested electronic devices 200. Upon receiving the pulse signals from the subsidiary decoder 142, the MCU of the test unit 15 can control the tested electronic device 200 electrically connected thereto to turn on and off according to the pulse signals. When the tested electronic device 200 is turned on and turned off, the test apparatus of the test unit 15 can measure the relevant characteristics of the tested device 200 in the on and off situations.

Number of the subsidiary code transmission units 16 equals number of the subsidiary code receiver units 14 and the number of the test units 15. Each of the subsidiary code transmission units 16 includes a subsidiary coder 161 electrically connected to a test unit 15 corresponding to the subsidiary code transmission unit 16, and a subsidiary transmitter 162 electrically connected to the subsidiary coder 161. When the corresponding test unit 15 obtains the relevant parameters of the tested electronic device 200 electrically connected thereto, the test unit 15 transmits data concerning the parameters to the subsidiary coder 161. The subsidiary coder 161 encodes this data to generate code signals, and the subsidiary transmitter 162 transmits the code signals using common wireless communication methods.

The main code receiver unit 17 includes a main receiver 171 and a main decoder 172. The main receiver 171 is electrically connected to the control unit 12 through the main decoder 172. The main receiver 171 can receive the code signals transmitted from the subsidiary transmitter 162 using common wireless communication methods, and the main decoder 172 can decode the code signals received by the main receiver 171 into the original data of the parameters of the tested electronic device 200. The data of the parameters of the tested electronic device 200 is transmitted to the processor unit 11 by the control unit 12, and the processor unit 11 can determine whether the tested electronic device 200 can work and shut down according to the known or predetermined parameters thereof.

When a plurality of electronic devices 200 require DC circuit quality tests, all of the electronic devices 200 can be simultaneously connected to the DC circuit testing device 100, wherein each of the electronic devices 200 is electrically connected to a corresponding test unit 15. Each of the test units 15 connected to the electronic devices 200 has a stored identification (ID) code, and all these ID codes are also stored in the control unit 12.

When an electronic device 200 is connected to any one of the test units 15, the control unit 12 adds the ID code corresponding to the selected test unit 15 to the pulse signals transmitted to the main code transmission unit 13. When the main coder 131 encodes the pulse signals and generates the code signals corresponding to the pulse signals, the ID code is added to the code signals. The code signals including the ID code are wirelessly transmitted to all of the subsidiary code receiver units 14 by the main transmitter 132. Each of the subsidiary code receiver units 14 decodes the code signals including the ID code to generate corresponding pulse signals and the ID code, and transmits the pulse signals and the ID code to the test unit 15 connected thereto. Upon receiving the pulse signals and the ID code, each of the test units 15 compares the ID code with its own stored ID code. If the ID code added to the pulse signals is in accordance with the ID code stored in a testing unit 15, the testing unit 15 actually testing the electronic device 200 turns the power on and off according to the pulse signals. Since only the testing unit 15 stores the same ID code as that added to the pulse signals, when all of the test units 15 receive the pulse signals with the ID code, only the selected test unit 15 can obtain a matching comparison and thus control the electronic device 200 according to the pulse signals.

Figure 2:
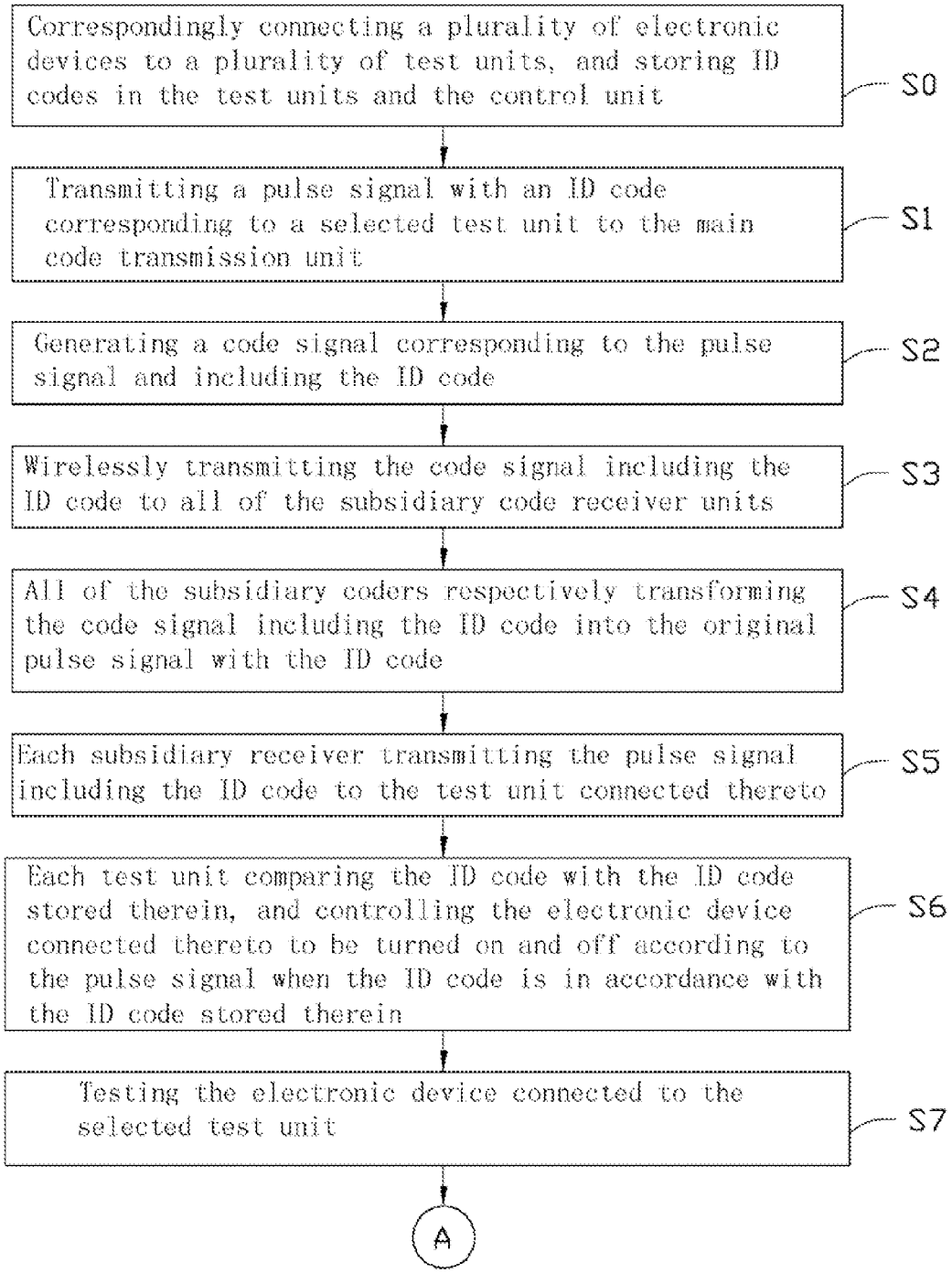
FIG. 2 is a flowchart portion of a method for using the DC circuit testing device shown in FIG. 1, according to an exemplary embodiment.
Figure 3:
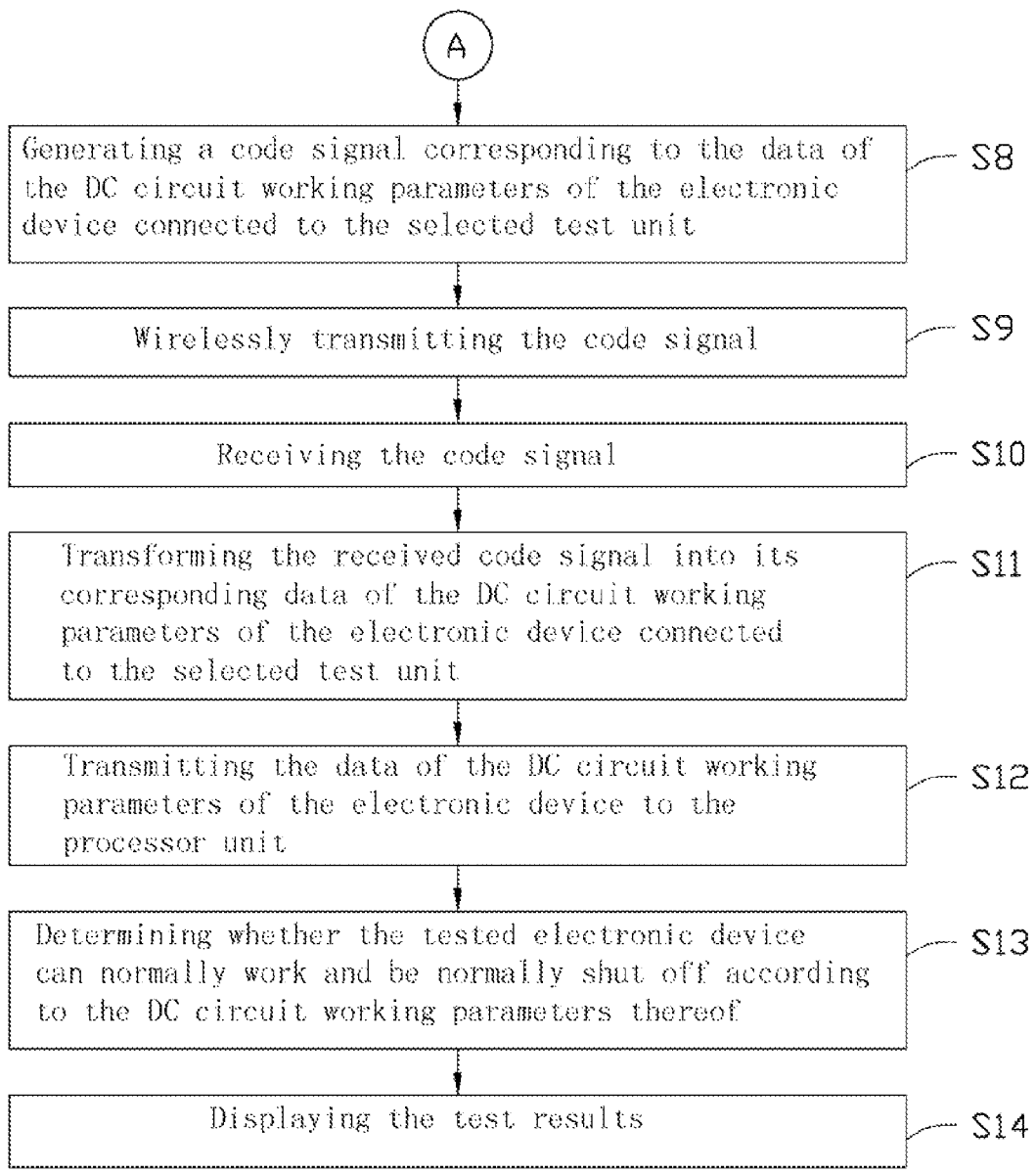
FIG. 3 is a continuation of FIG. 2.

FIG. 2 and FIG. 3 show a flowchart of method for using the DC circuit testing device 100 to test DC circuit quality of a plurality of electronic devices 200 connected thereto. The method includes these steps as follows. It should be known that depending on the embodiment, additional or less steps may be added or the ordering of the steps may be changed.

As described above, each of the tested electronic devices 200 is electrically connected to a corresponding test unit 15. Each of the test units 15 connected to the electronic devices 200 stores its own identification (ID) code, and the ID codes of all of the test units 15 connected to the electronic devices 200 are stored in the control unit 12 (Step S0).

When the electronic device 200 connects to any test units 15, the processor unit 11 sends a control signal to the control unit 12. The control signal instructs the switching on and off of the electronic device 200, and the relevant characteristics (for which the DC circuit is being tested) are read in the electronic device 200, such as the number of times and frequency for switching the electronic device 200 on and off. The control unit 12 transforms the control signal into a pulse signal, and adds the ID code corresponding to the selected test unit 15 to the pulse signal. Thus, the pulse signal with the ID code is transmitted to the main code transmission unit 13 (Step S1).

Upon receiving the pulse signals from the control unit 12, the main coder 131 encodes the pulse signal with the ID code to generate a code signal corresponding to the pulse signal and additionally including the ID code (Step S2), and the main transmitter 132 wirelessly transmits the code signal including the ID code to all of the subsidiary code receiver units 14 (Step S3). The subsidiary receiver 141 of each subsidiary code receivers unit 14 receives the code signal including the ID code from the main transmitter 132 (Step S4). The subsidiary decoder 142 of each subsidiary code receiver unit 14 decodes the code signal and the ID code to transform the code signal including the ID code into the original pulse signal with the ID code, and transmits the pulse signal including the ID code to the test unit 15 connected thereto (Step S5).

Upon receiving the pulse signal with the ID code, each of the test units 15 compares the ID code with its own stored ID code. If the ID code added to the pulse signals is in accordance with the ID code stored in a test unit 15, the test unit 15 cycles the electronic device 200 through on and off states according to the pulse signal (Step S6). Since only the selected test unit 15 stores the same ID code as that added to the pulse signals, when all of the test units 15 receive the pulse signal with the ID code, only the selected test unit 15 can obtain a match, and thus controls the electronic device 200. When the tested electronic device 200 connected to the selected test unit 15 is controlled according to the pulse signals, the test apparatus of the test unit 15 measure the relevant DC circuit working characteristics of the tested device 200 (Step S7).

When the selected test unit 15 obtains the relevant DC circuit working parameters of the electronic device 200 connected thereto, the selected test unit 15 transmits data of the parameters to its corresponding subsidiary coder 161. The subsidiary coder 161 encodes the data of the parameters to generate a code signal corresponding to the data of the parameters (Step S8), and the subsidiary transmitter 162 wirelessly transmits the code signal to the main code receiver unit 17 (Step S9).

The main receiver 171 receives the code signal from the subsidiary transmitter 162 (Step S10), and the main decoder 172 decodes the code signal received by the main receiver 171 to transform the code signal into its corresponding data of the DC circuit working parameters of the electronic device 200 connected to the selected test unit 15 (Step S11). The data of the DC circuit working parameters of the electronic device 200 is transmitted to the processor unit 11 by the control unit 12 (Step S12). Upon receiving the data, the processor unit 11 determines whether the tested electronic device 200 can work normally and shut down normally according to the DC circuit working parameters thereof (Step S13), and can display the test results (Step S14).

In the above-described method, the processor unit 11 can further generate a plurality of control signals respectively corresponding to a plurality of selected test units 15. The control signals can respectively include different parametric values in controlling the DC circuit quality tests of the electronic devices 200, such as the number of times and the frequencies for switching the electronic devices 200 on and off. The control unit 12 transforms the control signals into pulse signals and adds the ID codes corresponding to the selected test units 15 to the pulse signals. The main code transmission unit 13 transforms the pulse signals with the ID codes into code signals including the ID codes, and simultaneously transmits the code signals to all of the subsidiary code receiver units 14. Each of the subsidiary code receiver units 14 decodes all of the code signals received from the main code transmission unit 13 to transform the code signals including the ID codes into the original pulse signals with the ID codes. Each of the test units 15 compares the ID code added to the pulse signals with its own stored ID code. When an ID code added to one of the pulse signals is in accordance with an ID code stored in one of test unit 15, the test unit 15 controls the electronic device 100 to be turned on and off according to the pulse signal. In this way, each of the selected test unit 15 can identify its corresponding pulse signal with the ID code that is the same as the ID code stored in the test unit 15, and then control the electronic device 100 connected thereto to be turned on and off according to the corresponding pulse signal. Thus, the selected test units 15 respectively test the DC circuit quality of the electronic devices 200 connected thereto according to their corresponding pulse signals, such that a number of these electronic devices 200 can be simultaneously tested by the DC circuit test device 100.

When the selected test units 15 obtain the relevant DC circuit working parameters of the electronic devices 200 connected thereto and transmit data of the DC circuit working parameters to their corresponding subsidiary coders 161, each of the selected test units 15 adds the ID code stored therein to the data of the DC circuit working parameters of the electronic device 200 connected thereto. The subsidiary code transmission units 16 connected to the selected test units 15 respectively encode the data with the ID codes to generate corresponding code signals including the ID codes, and wirelessly transmit the code signals with the ID codes to the main code receiver unit 17. The main code receiver unit 17 receives all of the code signal, and decodes all of the code signals to transform the code signals into their corresponding data of the DC circuit working parameters of the tested electronic devices 200 with the ID codes stored in the selected test units 15. When the processor unit 11 receives the data of the DC circuit working parameters of the tested electronic devices 200 with the ID codes, the processor unit 11 can identify the data of the DC circuit working parameters of each tested electronic device 200 according to the ID code added to the data, and respectively determines whether each tested electronic device 200 can normally work and be normally shut off.

The DC circuit testing device 100 can automatically and simultaneously test DC circuit quality of a plurality of electronic devices 200. Compared with common DC quality testing devices, the DC circuit testing device 100 is easier to operate and achieves a higher working efficiency. Furthermore, in the DC circuit testing device 100, the processor unit 11, the control unit 12, the main code transmission unit 13, and the main code receiver unit 17 can form a first subassembly, and each of the test units 15, the subsidiary code receiver unit 14 connected to the test unit 15, and the subsidiary code transmission unit 16 connected to the test unit 15 can form a second subassembly. Since the first subassembly and the second subassembly communicate wirelessly with each other, they can be positioned at different positions without constraint, such that a more efficient use of space can be achieved.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A testing device in electronic communication with a plurality of test units electrically connected to electronic devices, each of the test units storing a corresponding identification (ID) code; the testing device comprising:
   a control unit that stores the ID codes corresponding to all of the test units and wirelessly communicating with all of the test units; and
   a processor unit electrically connected to the control unit; wherein the processor unit executes instructions comprising:
      generating control signals for the electronic devices electrically connected to one or more test units selected from the test units;
      wirelessly transmitting the control signals with the ID codes added by the control unit that correspond to the selected test units to all of the test units; and
      controlling the test units to turn on and off the electronic devices according to a comparison of the ID codes added to the control signals with the ID code stored in each of the test units.

2. The testing device as claimed in claim 1, wherein when the selected test units obtain relevant DC circuit working parameters of the electronic devices connected to the selected test units, each of the selected test units adds the ID code stored in the selected test unit to the data of the DC circuit working parameters of the electronic device connected to the selected test unit; the data of the DC circuit working parameters of the electronic devices with the ID codes is wirelessly transmitted to the control unit and the processor unit, and the processor unit identifies the data of the DC circuit working parameters of the electronic devices according to the ID codes added to the data and determines whether the electronic devices can normally work and be normally shut off.

3. The testing device as claimed in claim 2, further comprising a main code transmission unit electrically connected to the control unit; wherein the control unit transforms the control signals into pulse signals, and the main code transmission unit adds the ID codes to the pulse signals, transforms the pulse signals with the ID code into corresponding code signals including the ID codes, and wirelessly transmits the code signals including the ID codes.

4. The testing device as claimed in claim 3, further comprising a plurality of subsidiary code receiver units corresponding to the test units; each of the subsidiary code receiver units electrically connected to its corresponding test unit for wirelessly receiving the code signals including the ID codes from the main code transmission unit, transforming the code signals including the ID codes into their corresponding pulse signals with the ID codes, and providing the pulse signals with the ID codes to all of the test units as the control signals with the ID codes.

5. The testing device as claimed in claim 2, further comprising a plurality of subsidiary code transmission units corresponding to the test units, each of the subsidiary code transmission units electrically connected to its corresponding test unit; when the test unit tests DC circuit quality of the electronic device connected to the test unit, the test unit adding the ID code stored in the test unit to data of the DC circuit working parameters; the subsidiary code transmission unit transforming the data of the DC circuit working parameters of the tested electronic device with the ID code into a code signal including the ID code, and wirelessly transmitting the code signal including the ID code.

6. The testing device as claimed in claim 5, further comprising a main code receiver unit electrically connected to the control unit; the main code receiver unit wirelessly receiving the code signals including the ID codes from the subsidiary code transmission units, and transforming the code signals including the ID code into the data of the DC circuit working parameters of the electronic devices with the ID codes, such that the data of the DC circuit working parameters of each electronic device is identified according to the ID code added to the data.

7. A method for test direct current (DC) circuit quality of electronic devices, comprising:
   correspondingly connecting the electronic devices to a plurality of test units, each of the test units storing a corresponding identification (ID) code;

generating control signals for the electronic devices connected to one or more test units selected from the test units;

adding the ID codes corresponding to the selected test units to the control signals, and wirelessly transmitting the control signals with the ID codes to all of the test units;

each of the test units comparing the ID codes added to the control signals with its own stored ID code; and when the ID code added to a control signal is in accordance with the ID code stored in one of the test units, the test unit controlling the electronic device electrically connected to the test unit to be turned on and off according to the control signal and thereby testing the DC circuit working quality of the electronic device.

8. The method as claimed in claim 7, further comprising:

when the selected test units obtain relevant DC circuit working parameters of the electronic devices connected to the selected test units the test, each of the selected test units adding the ID code stored in the selected test unit to the data of the DC circuit working parameters of the electronic device connected to the selected test unit;

wireless transmitting the data of the DC circuit working parameters of the electronic devices with the ID codes to the control unit; and using a processor unit connected to the control unit to identify the data of the DC circuit working parameters of the electronic devices according to the ID codes added to the data, and determine whether the electronic devices can normally work and be normally shut off.

9. The method as claimed in claim 8, further comprising:

transforming the control signals into pulse signals with the ID codes corresponding to the selected test units, and further transforming the pulse signals with the ID codes into code signals including the ID codes;

wirelessly transmitting the code signals including the ID codes;

wirelessly receiving the code signals including the ID codes; and transforming the code signals including the ID codes into their corresponding pulse signals with the ID codes, and providing the pulse signals to all of the test units as the control signals including the ID codes.

10. The method as claimed in claim 8, further comprising:

when a test unit tests DC circuit quality of the electronic device connected to the test unit, the test unit adding the ID code stored in the test unit to data of the DC circuit working parameters;

transforming the data of the DC circuit working parameters of the electronic device with the ID code into a code signal including the ID code;

wirelessly transmitting the code signal including the ID code.

wirelessly receiving the code signals including the ID codes;

transforming the code signals including the ID code into the data of the DC circuit working parameters of the electronic device with the ID codes; and identifying the data of the DC circuit working parameters of the electronic device according to the ID code added to the data.

* * * * *